(12) United States Patent
You et al.

(10) Patent No.: US 9,552,868 B2
(45) Date of Patent: Jan. 24, 2017

(54) SEMICONDUCTOR MEMORY DEVICE HAVING VARIOUS COLUMN REPAIR MODES

(71) Applicant: SK hynix Inc., Gyeonggi-do (KR)

(72) Inventors: Jung-Taek You, Gyeonggi-do (KR); Hyun-Gyu Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/796,976

(22) Filed: Jul. 10, 2015

(65) Prior Publication Data

US 2016/0254064 A1 Sep. 1, 2016

(30) Foreign Application Priority Data

Feb. 27, 2015 (KR) .......................... 10-2015-0028106

(51) Int. Cl.
| | | |
|---|---|---|
| *G11C 29/00* | (2006.01) | |
| *G11C 11/4091* | (2006.01) | |
| *G11C 11/408* | (2006.01) | |
| *G11C 7/02* | (2006.01) | |

(52) U.S. Cl.
CPC ........ *G11C 11/4091* (2013.01); *G11C 11/4087* (2013.01); *G11C 29/78* (2013.01); *G11C 29/808* (2013.01); *G11C 7/02* (2013.01)

(58) Field of Classification Search
CPC ....... G11C 29/808; G11C 29/04; G11C 29/42; G11C 29/44
USPC .................................................. 365/200, 201
See application file for complete search history.

(56) References Cited

U.S. PATENT DOCUMENTS

2014/0254297 A1* 9/2014 Hung ..................... G11C 29/04
365/200

FOREIGN PATENT DOCUMENTS

KR 101052078 7/2011

* cited by examiner

*Primary Examiner* — Huan Hoang
(74) *Attorney, Agent, or Firm* — IP & T Group LLP

(57) ABSTRACT

A memory device including first to fourth cell blocks, each including a plurality of normal columns and one or more redundancy columns and a control unit suitable for repairing the normal columns using the redundancy columns in the first and the second cell blocks using first repair information and repairing the normal columns using the redundancy columns in the third and the fourth cell blocks using second repair information when the memory device is set as a first mode, and suitable for repairing the normal columns using the redundancy columns in the first and the third cell blocks using the first repair information and repairing the normal columns using the redundancy columns in the second and the fourth cell blocks using the second repair information when the memory device is set as a second mode.

19 Claims, 13 Drawing Sheets

FIG. 8A

SEMICONDUCTOR MEMORY DEVICE HAVING VARIOUS COLUMN REPAIR MODES

CROSS-REFERENCE TO RELATED APPLICATIONS

The present application claims priority of Korean Patent Application No. 10-2015-0028106, filed on Feb. 27, 2015, which is incorporated herein by reference in its entirety.

BACKGROUND

1. Field

Exemplary embodiments of the present invention relate to a memory device.

2. Description of the Related Art

A memory device, such as Double Data Rate Synchronous DRAM (DDR SDRAM), has many memory cells. As the degree of integration of memory devices is increased, the number of memory cells also increases. The memory cells are regularly arranged to form an array, which is also called a memory cell block.

If memory cells of a memory device are defective, the memory device is discarded because it is unable to perform as required. As the process technology of memory devices advances, defects occur stochastically in only a small number of memory cells. If memory devices are discarded due to defective memory cells, product yield is negatively impacted. Therefore, memory devices include redundancy memory cells. If a defect occurs in the memory cells, they are replaced with the redundancy memory cells.

The operation of replacing defective memory cells with redundancy memory cells is called a "repair operation." In particular, an operation for replacing a defective column (or bit line) with another column is called a "column repair operation." A defective memory cell that needs to be replaced with a redundancy memory cell is called a "repair target memory cell."

The memory cell structure of memory devices may be divided into folded bit line structures and open bit line structures, which have the following differences.

In the folded bit line structure, a bit line (e.g., a primary bit line) for driving data and a bit line (e.g., a secondary bit line) as a standard for an amplification operation are disposed in the same memory cell block on the basis of a bit line sense amplifier, which is disposed in the core region of a memory device. For this reason, the same noise is reflected in the primary bit line and the secondary bit line. These noises have mutual action so they are offset. The folded bit line structure supports stable operation when there is noise through this method. In the open bit line structure, a primary bit line and a secondary bit line are disposed in different memory cell blocks on the basis of a bit line sense amplifier. Accordingly, the open bit line structure is vulnerable to noise because the noise generated in the primary bit line is different than the noise generated in the secondary bit line.

FIG. 1 is a diagram illustrating part of the core region of a memory device having the open bit line structure, and FIG. 2 is a diagram illustrating a column control unit for controlling the column repair operation on the core region.

Referring to FIG. 1, the memory device may include memory blocks 110 and 120 and sense amplification units 130, 140, and 150. Each of the memory blocks 110 and 120 includes a plurality of word lines WL and a plurality of bit lines BL1/BLB1-BL3/BLB3 and may include redundancy bit lines RBL/RBLB for repairing defective bit lines. Each of the sense amplification units 130, 140, and 150 may include a plurality of sense amplifiers SA1 and SA4 for amplifying the data of corresponding bit lines BL1/BLB1-BL3/BLB3 or redundancy bit lines RBL/RBLB.

In the memory device of FIG. 1, column repairs may be independently performed on the memory block 110 and the memory block 120. For example, the bit lines BL1/BLB1 of the memory block 110 may be repaired by the redundancy bit lines RBL/RBLB of the memory block 110. The bit lines BL2/BLB2 of the memory block 120 may be replaced with the redundancy bit lines RBL/RBLB of the memory block 120 regardless of the column repair of the memory block 110.

A column control unit 210 may include fuse sets FS1 and FS2 for storing repair information for a column repair. The repair information may include the address of a column repaired by the redundancy bit lines RBL/RBLB, that is, a column address.

The column control unit 210 may select a column to be accessed in response to a column address CA and repair information RI1 and RI2. The column control unit 210 generates column selection signals Y1-Y3, and RY and may enable a column selection signal corresponding to a selected column. The column selection signal Y1 corresponds to the first sense amplifier SA1, and the column selection signal Y2 corresponds to the second sense amplifier SA2, and the column selection signal Y3 corresponds to the third sense amplifier SA3, and the column selection signal RY corresponds to the fourth sense amplifier SA4. The data of a bit line connected to a sense amplifier corresponding to an enabled column selection signal may be accessed.

A block selection signal XMAT<1:2> may be activated corresponding to a selected one of the memory blocks 110 and 120. The fuse set FS1 may store the repair information RI1 corresponding to the memory block 110. When the block selection signal XMAT<1> is enabled, the fuse set FS1 may output the stored repair information RI1. The fuse set FS2 may store the repair information RI2 corresponding to the memory block 120. When the block selection signal XMAT<2> is enabled, the fuse set FS2 may output the stored repair information RI2.

The column control unit 210 may enable one of the column selection signals Y1-Y3 that corresponds to the column address CA, but may enable the column selection signal RY if the column address CA and the repair information RI1 and R12 of a selected fuse set are the same. For example, in the memory device of FIG. 1, it is described that an address corresponding to a column including the bit lines BL1/BLB1 has been stored in the fuse set FS1 and an address corresponding to a column including the bit lines BL2/BLB2 has been stored in the fuse set FS2. When the memory block 110 is selected, the block selection signal XMAT<1> is enabled and the repair information RI1 is outputted. If the column address CA and the repair information RI1 are different, the column control unit 210 may enable one of the column selection signals Y1-Y3 that corresponds to the column address CA. If the column address CA and the repair information RI1 are the same, the column control unit 210 may enable the column selection signal RY. Furthermore, when the memory block 120 is selected, the block selection signal XMAT<2> is enabled and the repair information RI2 is outputted. If the column address CA and the repair information RI2 are different, the column control unit 210 may enable one of the column selection signals Y1-Y3 that corresponds to the column address CA. If the column address CA and the repair information RI2 are the same, the column control unit 210 may enable the column selection signal RY.

The flexibility of a column repair is an important factor in increasing the yield of a memory device. Accordingly, research is being carried out on various methods for increasing the flexibility of a column repair.

SUMMARY

Various embodiments are directed to a memory device, which supports various column repair modes and is capable of selecting a column repair mode in which more columns can be repaired.

Also, various embodiments are directed to a memory device having an improved yield by increasing the flexibility of a column repair.

In an embodiment, a memory device may include first to fourth cell blocks each including a plurality of normal columns and one or more redundancy columns and a control unit suitable for repairing the normal columns using the redundancy columns in the first and the second cell blocks using first repair information and repairing the normal columns using the redundancy columns in the third and the fourth cell blocks using second repair information when the memory device is set as a first mode, and suitable for repairing the normal columns using the redundancy columns in the first and the third cell blocks using the first repair information and repairing the normal columns using the redundancy columns in the second and the fourth cell blocks using the second repair information when the memory device is set as a second mode.

In an embodiment, a memory device may include a plurality of row blocks each including a plurality of cell blocks each including a plurality of normal columns and one or more redundancy columns and a control unit suitable for storing a plurality of pieces of repair information each corresponding to one of the row blocks in a first mode and corresponding to two or more of the row blocks in a second mode, wherein the control unit repairs normal columns using redundancy columns in a plurality of cell blocks corresponding to the one of the row blocks in the first mode, and repairs normal columns using redundancy columns in one or more of cell blocks corresponding to the two or more of the row blocks in the second mode.

In an embodiment, a memory device may include first to N-th row blocks each including first to M-th cell blocks each including a plurality of normal columns and one or more redundancy columns, wherein the N and M are natural numbers and the first to M-th cell blocks are divided into first and second groups and a control unit suitable for storing first to N-th repair information, wherein K-th repair information corresponds to a K-th row block in a first mode, and K-th and (K+1)-th repair information each corresponds to both K-th and (K+1)-th row blocks in a second mode, and the K is an odd number of $1 \leq K < N$, wherein the control unit repairs normal columns using redundancy columns in first to M-th cell blocks of the K-th row block using the K-th repair information in a first mode, and repairs normal columns using redundancy columns in a first group of cell blocks of the K-th and (K+1)-th row blocks using the K-th repair information and normal columns using redundancy columns in a second group of cell blocks of the K-th and (K+1)-th row blocks using the (K+1)-th repair information.

BRIEF DESCRIPTION OF THE DRAWINGS

FIGS. 8A and 8B illustrate the configuration of a memory device in accordance with another embodiment of the present invention.

DETAILED DESCRIPTION

Figure 1:
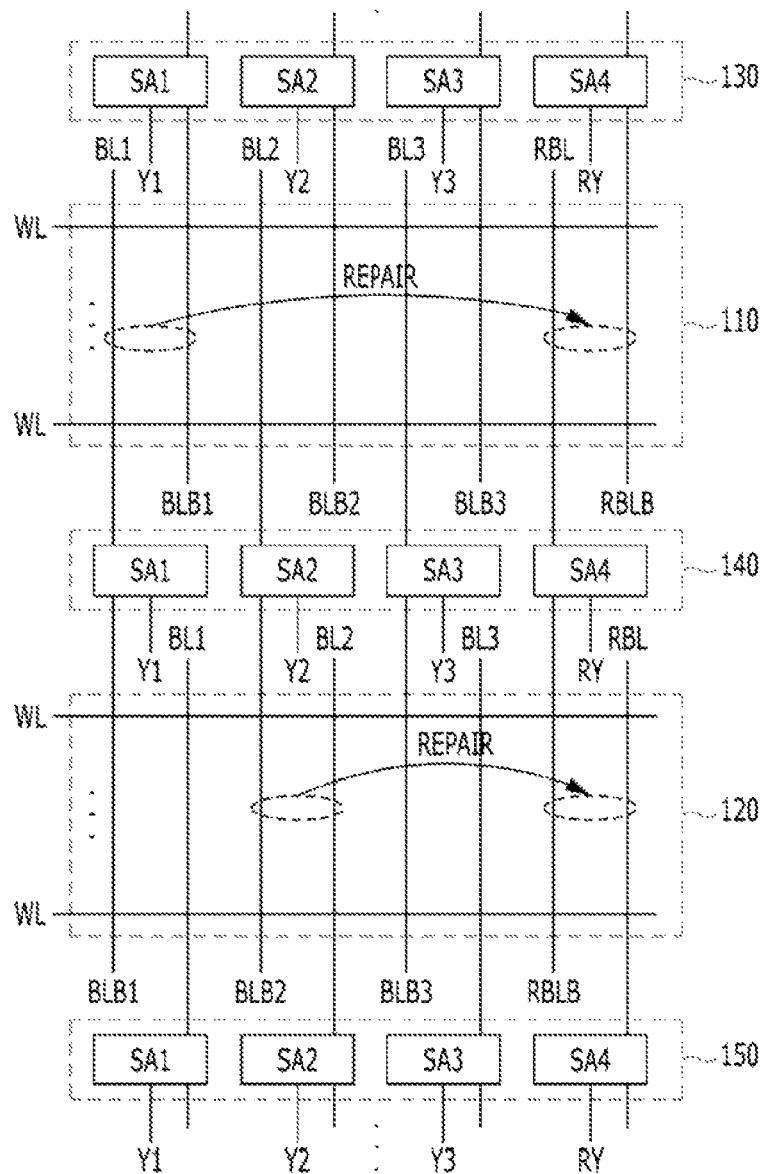
FIG. 1 is a diagram illustrating part of the core region of a memory device having an open bit line structure.
Figure 2:
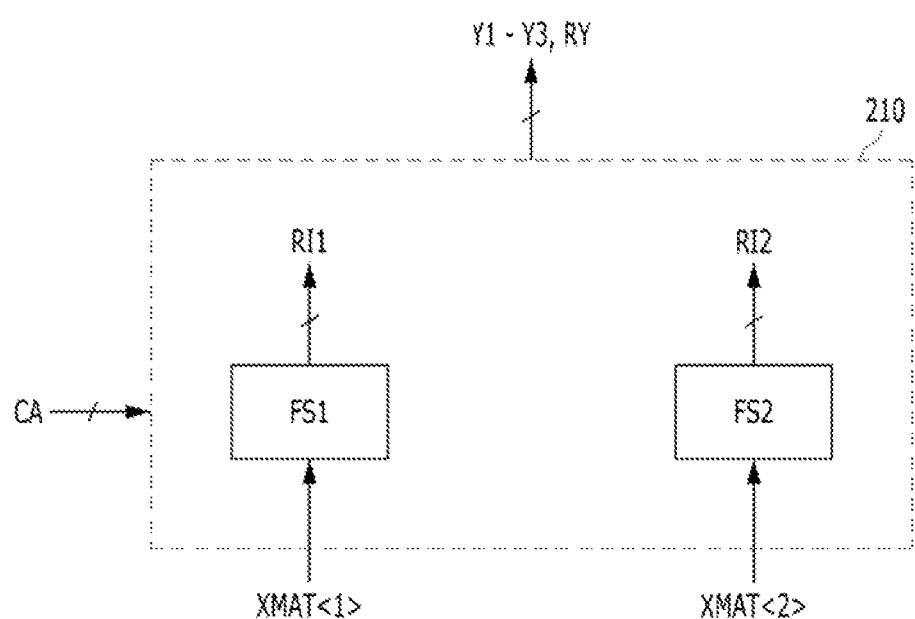
FIG. 2 is a diagram illustrating a column control unit for controlling the column repair operation of the core region.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
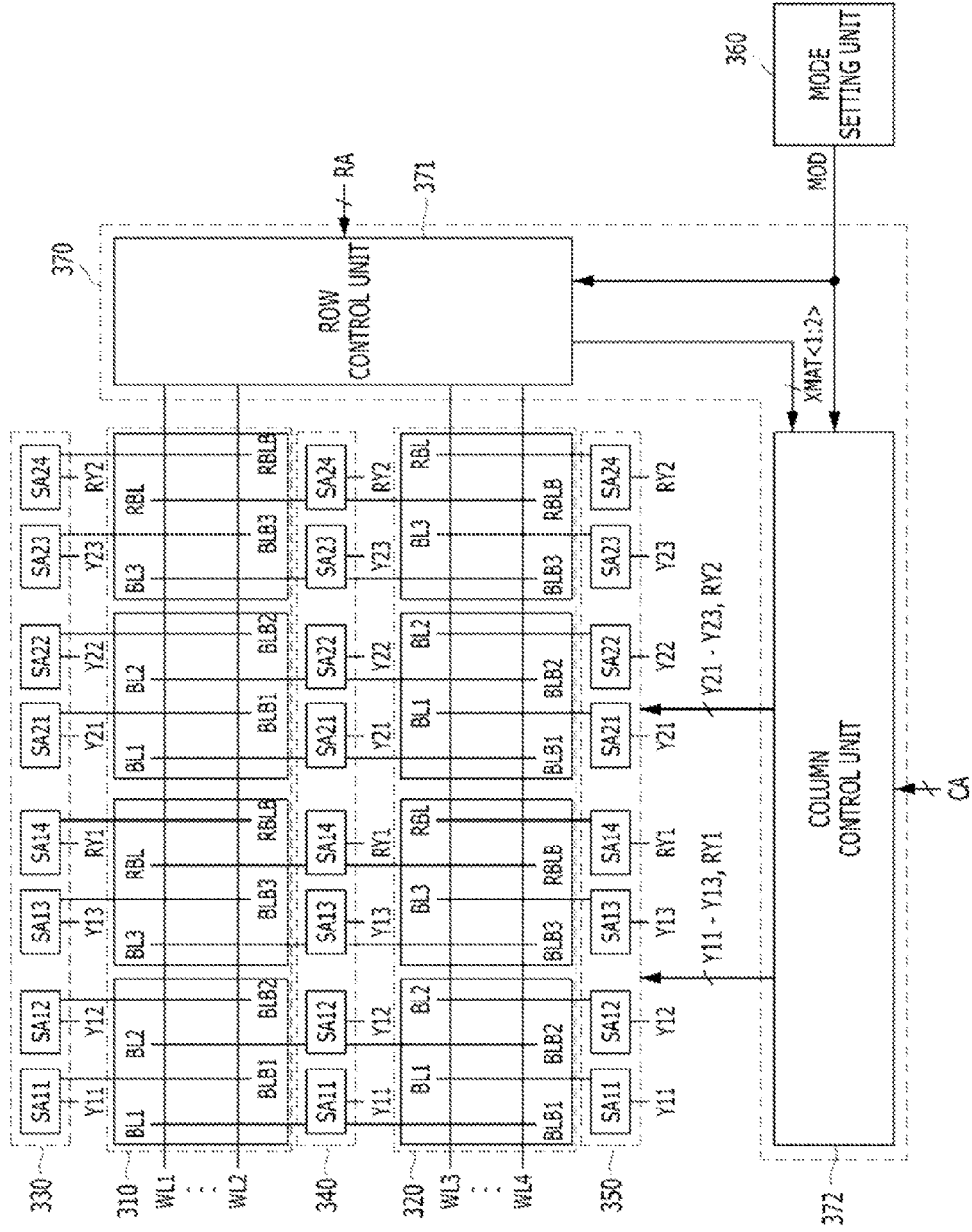
FIG. 3 illustrates the configuration of a memory device in accordance with an embodiment of the present invention.

FIG. 3 illustrates the configuration of a memory device in accordance with an embodiment of the present invention.

Referring to FIG. 3, the memory device may include first and second row blocks 310 and 320, first to third sense amplification units 330-350, a mode setting unit 360, and a control unit 370. The first and the second row blocks 310 and 320 may include first and second cell blocks 311 and 312 and third and fourth cell blocks 321 and 322 (illustrated in FIG. 5).

Hereinafter, a first mode may be an operation mode in which the columns of the first and the second cell blocks 311 and 312 are repaired using first repair information RI1 (illustrated in FIG. 4) and the columns of the third and the fourth cell blocks 321 and 322 are repaired using second repair information RI2 (illustrated in FIG. 4). Furthermore, a second mode may be an operation mode in which the columns of the first and third cell blocks 311 and 321 are repaired using the first repair information RI1 and the columns of the second and the fourth cell blocks 312 and 322 are repaired using the second repair information RI2.

Each of the first to fourth cell blocks 311, 312, 321, and 322 may include normal columns BL1/BLB1-BL3/BLB3 and a redundancy column RBL/RBLB for replacing defective normal columns. Each of the columns may include the bit line pair BL1/BLB1-BL3/BLB3 and RBL/RBLB. The first and the second cell blocks 311 and 312 may correspond to a plurality of first word lines WL1-WL2, and the third and the fourth cell blocks 321 and 322 may correspond to a plurality of second word lines WL3-WL4. Memory cells (illustrated in FIG. 3) may be connected between each bit line and each word line. The first to fourth cell blocks 311, 312, 321, and 322 may have an open bit line structure.

Each of the first to third sense amplification units 330-350 may include a plurality of first sense amplifiers SA11-SA14 and a plurality of second sense amplifiers SA21-SA24. The first sense amplifiers SA11-SA14 of the first to third sense amplification units 330-350 may be connected to the columns of the first or third cell block 311 or 321, and the second sense amplifiers SA21-SA24 of the first to third sense amplification units 330-350 may be connected to the columns of the second or fourth cell block 321 or 322. In particular, the first sense amplifiers SA11-SA14 of the second sense amplification unit 340 may be connected to corresponding columns of the normal columns or redundancy columns of the first and third cell blocks 311 and 321, and may sense and amplify the data of a connected column. Furthermore, the second sense amplifiers SA21-SA24 of the second sense amplification unit 340 may be connected to corresponding columns of the normal columns or redundancy columns of the second and the fourth cell blocks 312 and 322, and may sense and amplify the data of a connected column.

The first sense amplifiers SA11-SA14 may respectively correspond to first column selection signals Y11-Y13 and RY1, and may be selected when the respective first column selection signals are enabled. The second sense amplifiers SA21-SA24 may respectively correspond to second column selection signals Y21-Y23 and RY2, and may be selected when the respective second column selection signals are enabled.

The mode setting unit 360 may store setting information for setting the memory device as one of the first mode and the second mode and generate a mode signal MOD indicating which one of the first and second modes the memory device has been set as. The mode setting unit 360 may enable the mode signal MOD if the memory device is set as the first mode, and disable the mode signal MOD if the memory device is set as the second mode.

If the memory device is set as the first mode, the control unit 370 may repair a normal column using a redundancy column in the first and the second cell blocks 311 and 312 using the first repair information RI1 and may repair a normal column using a redundancy column in the third and the fourth cell blocks 321 and 322 using the second repair information RI2. Furthermore, if the memory device is set as the second mode, the control unit 370 may repair a normal column using a redundancy column in the first and third cell blocks 311 and 321 using the first repair information RI1 and may repair a normal column using a redundancy column in the second and the fourth cell blocks 312 and 322 using the second repair information RI2.

The control unit 370 may include a row control unit 371 and a column control unit 372. The row control unit 371 may select the first and the second row blocks 310 and 320 in response to a row address RA and generate first and second block selection signals XMAT<1> and XMAT<2> based on a selected mode of the first mode and the second mode. If the memory device is set as the first mode, the row control unit 371 may enable the first block selection signal XMAT<1> when the first row block 310 is selected by the row address RA and may enable the second block selection signal XMAT<2> when the second row block 320 is selected by the row address RA. Furthermore, if the memory device is set as the second mode, when the first row block 310 or the second row block 320 is selected by the row address RA, the row control unit 371 may enable both the first and the second block selection signals XMAT<1:2>.

The column control unit 372 may select a normal column or a redundancy column in a cell block selected in response to the column address CA, the first and the second block selection signals XMAT<1:2>, and the pieces of first and second repair information RI1 and RI2. The column control unit 372 generates the plurality of first and second column selection signals Y11-Y13, RY1, Y21-Y23, and RY2, but may enable a column selection signal corresponding to a selected column.

Figure 4:
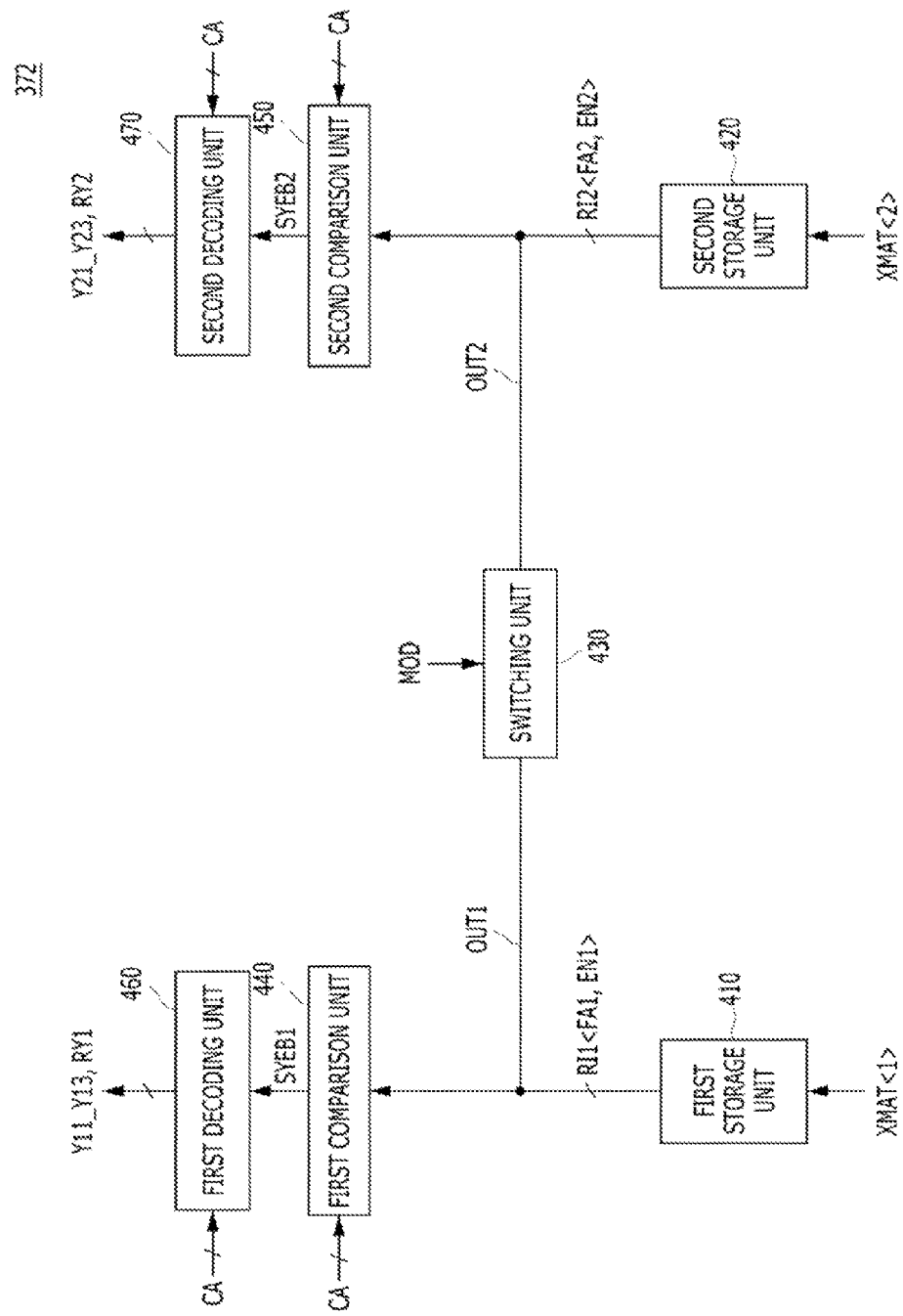
FIG. 4 illustrates the configuration of a column control unit 372 of FIG. 3.

FIG. 4 illustrates the configuration of the column control unit 372 of FIG. 3.

Referring to FIG. 4, the column control unit 372 may include first and second storage units 410 and 420, first and second output buses OUT1 and OUT2, a switching unit 430, first and second comparison units 440 and 450, and first and second decoding units 460 and 470.

The first storage unit 410 stores the first repair information RI1 and may output the first repair information RI1 when the first block selection signal XMAT<1> is enabled. The second storage unit 420 stores the second repair information RI2 and may output the second repair information RI1 when the second block selection signal XMAT<2> is enabled. For reference, the repair information RI1/RI2 may include a column address FA1/FA2 corresponding to a normal column that includes a defect and needs to be replaced with a redundancy column and information EN1/EN2 indicating whether repair information has been stored in the storage unit.

The first output bus OUT1 includes a signal transfer line. The first output bus OUT1 is connected to the output terminal of the first storage unit 410, and may transfer the first repair information RI1 outputted by the first storage unit 410. The second output bus OUT2 includes a signal transfer line. The second output bus OUT2 is connected to the output terminal of the second storage unit 420, and may transfer the second repair information RI2 outputted by the second storage unit 420.

The switching unit 430 is coupled between the first and the second output buses OUT1 and OUT2. The switching unit 430 may connect the first and the second output buses OUT1 and OUT2 in the first mode and blocks the first and the second output buses OUT1 and OUT2 in the second mode.

When the information EN1 transferred through the first output bus OUT1 is enabled, the first comparison unit 440 compares the column address FA1 of the first output bus OUT1 with the column address CA. The first comparison unit 440 may enable a first comparison signal SYEB1 if the column address FA1 is identical to the column address CA and may disable the first comparison signal SYEB1 if the column address FA1 is different from the column address CA. When the information EN2 transferred through the second output bus OUT2 is enabled, the second comparison unit 450 compares the column address FA2 of the second output bus OUT2 with the column address CA. The second comparison unit 450 may enable a second comparison signal SYEB2 if the column address FA2 is identical to the column address CA and may disable the second comparison signal SYEB2 if the column address FA2 is different from the column address CA.

The first decoding unit 460 enables a first column selection signal corresponding to the column address CA, but may enable the first column selection signal RY1 corresponding to a redundancy column when the first comparison signal SYEB1 is enabled. The second decoding unit 470 enables a second column selection signal corresponding to the column address CA, but may enable the second column selection signal RY2 corresponding to a redundancy column when the second comparison signal SYEB2 is enabled.

The operation of the memory device of FIG. 3 is described below with reference to FIGS. 5 and 6.

Figure 5:
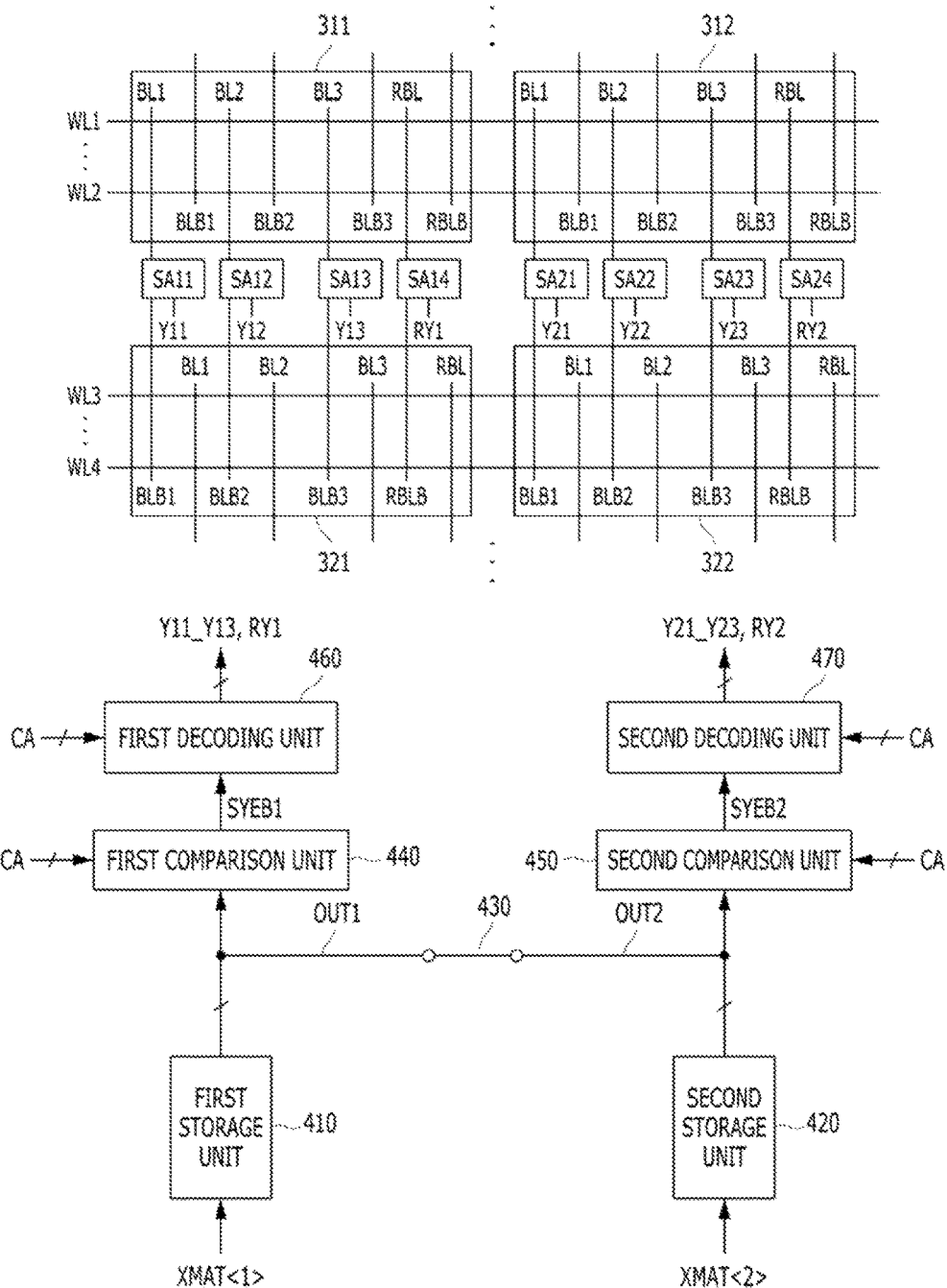
FIG. 5 is a diagram illustrating the operation of the memory device of FIG. 3 if the memory device is set as a first mode.

FIG. 5 is a diagram illustrating the operation of the memory device of FIG. 3 if the memory device is set as the first mode. For example, FIG. 5 illustrates that the first repair information RI1 includes a column address corresponding to the first column BL1/BLB1 of each cell block and the second repair information RI2 includes a column address corresponding to the second column BL2/BLB2 of each cell block. The mode signal MOD is enabled, and the switching unit 430 is turned on, and thus the first and the second output buses OUT1 and OUT2 are coupled.

When the first block selection signal XMAT<1> is enabled, the column control unit 372 may generate the column selection signals Y11-Y13, RY1, Y21-Y23, and RY2 in response to the first repair information RI. When the second block selection signal XMAT<2> is enabled, the column control unit 372 may generate the column selection signals Y11-Y13, RY1, Y21-Y23, and RY2 in response to the second repair information RI2.

When a word line of the first row block 310 is selected by the row address RA, the selected word line is activated and the first block selection signal XMAT<1> is enabled. Accordingly, the first repair information RI1 of the first storage unit 410 is outputted. The first repair information RI1 is transferred to the first comparison unit 440 through the first output bus OUT1 and transferred to the second comparison unit 450 through the second output bus OUT2.

If the column address CA is different from the column address FA1 (i.e., if the column address CA corresponds to another normal column other than the first normal column BL1/BLB1), the first and the second comparison units 440 and 450 disable the first and the second comparison signals SYEB1 and SYEB2, respectively. When the respective comparison signals SYEB1 and SYEB2 are disabled, the first and the second decoding units 460 and 470 enable the first and the second column selection signals corresponding to the column address CA. For example, if the column address CA corresponds to the second column BL2/BLB2, the first and the second decoding units 460 and 470 may enable the column selection signals Y12 and Y22.

If the column address CA is the same as the column address FA1 (i.e., if the column address CA corresponds to the first normal column BL1/BLB1), the first and the second comparison units 440 and 450 enable the first and the second comparison signals SYEB1 and SYEB2, respectively. When the respective comparison signals SYEB1 and SYEB2 are enabled, the first and the second decoding units 460 and 470 enable the respective redundancy column selection signals RY1 and RY2 corresponding to the redundancy column RBL/RBLB instead of the column selection signals Y11 and Y21 corresponding to the column address CA.

When a word line of the second row block 320 is selected by the row address RA, the selected word line is activated and the second block selection signal XMAT<2> is enabled. Accordingly, the second repair information RI2 of the second storage unit 420 is outputted. The second repair information RI2 is transferred to the first comparison unit 440 through the first output bus OUT1 and transferred to the second comparison unit 450 through the second output bus OUT2.

In the same manner as that described above, if the column address CA is different from the column address FA2, the first and the second comparison signals SYEB1 and SYEB2 are disabled. The first and the second decoding units 460 and 470 enable the first and the second column selection signals corresponding to the column address CA. For example, if the column address CA corresponds to the third column BL3/BLB3, the first and the second decoding units 460 and 470 may enable the respective column selection signals Y13 and Y23. Furthermore, if the column address CA is the same as the column address FA2, the first and the second comparison signals SYEB1 and SYEB2 are enabled. When the respective comparison signals SYEB1 and SYEB2 are enabled, the first and the second decoding units 460 and 470 enable the redundancy column selection signals RY1 and RY2 instead of the column selection signals Y12 and Y22 corresponding to the column address CA.

If the memory device is set as the first mode, the same column is repaired by a redundancy column in the first and the second cell blocks 311 and 312 and the same column is repaired by a redundancy column in the third and the fourth cell blocks 321 and 322.

Figure 6:
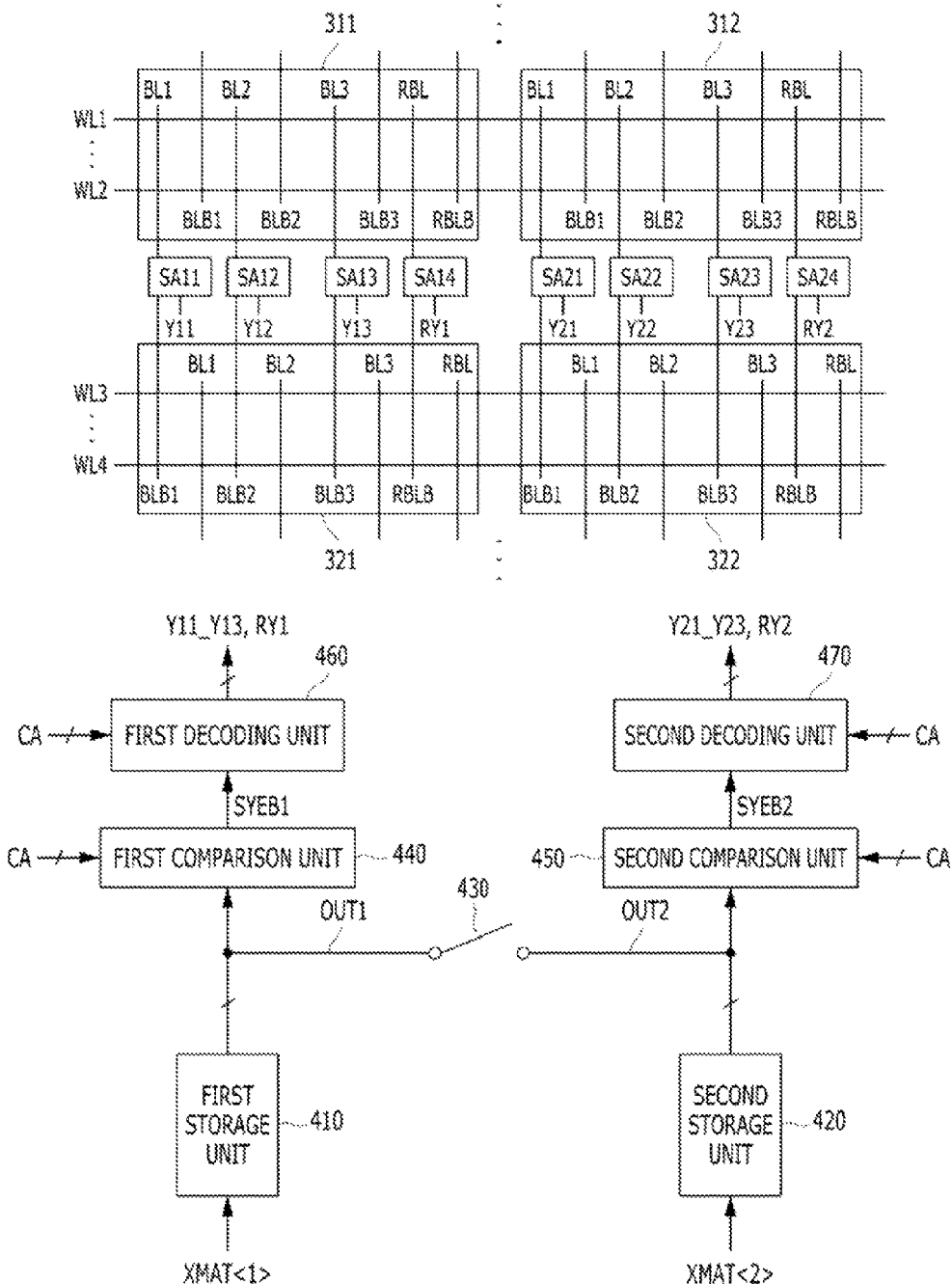
FIG. 6 is a diagram illustrating the operation of the memory device of FIG. 3 if the memory device is set as a second mode.

FIG. 6 is a diagram illustrating the operation of the memory device of FIG. 3 if the memory device is set as a second mode. For example, FIG. 6 illustrates that the pieces of repair information RI1 and RI2 include the same column addresses as those of FIG. 5. In FIG. 6, the row control unit 371 is not illustrated. The mode signal MOD is disabled, and the switching unit 430 is turned off, and the first and the second output buses OUT1 and OUT2 are blocked.

The column control unit 372 may generate the first column selection signals Y11-Y13, and RY1 in response to the first repair information RI1 and generate the second column selection signals Y21-Y23, and RY2 in response to the second repair information RI2.

When a word line of the first row block 310 is selected by the row address RA, the selected word line is activated and the first and the second block selection signals XMAT<1> and XMAT<2> are enabled. Accordingly, the pieces of first and second repair information RI1 and RI2 of the first and the second storage units 410 and 420 are outputted. The first repair information RI1 is transferred to the first comparison unit 440 through the first output bus OUT1, and the second repair information RI2 is transferred to the second comparison unit 450 through the second output bus OUT2.

If the column address CA corresponds to the first column BL1/BLB1, the first comparison unit 440 enables the first comparison signal SYEB1 because the column address CA is the same as the column address FA1, and the second comparison unit 450 disables the second comparison signal SYEB2 because the column address CA is different from the column address FA2. The first decoding unit 460 enables the redundancy column selection signal RY1 instead of the column selection signal YI1 corresponding to the column address CA because the first comparison signal SYEB1 has been enabled. The second decoding unit 470 enables the column selection signal Y21 corresponding to the column address CA because the second comparison signal SYEB2 has been disabled.

If the column address CA corresponds to the second column BL2/BLB2, the first comparison unit 440 disables the first comparison signal SYEB1 because the column address CA is different from the column address FA1. The second comparison unit 450 enables the second comparison signal SYEB2 because the column address CA is the same as the column address FA2. The first decoding unit 460 enables the column selection signal Y12 corresponding to the column address CA because the first comparison signal SYEB1 has been disabled. The second decoding unit 470 enables the redundancy column selection signal RY2 instead of the column selection signal Y22 corresponding to the column address CA because the second comparison signal SYEB2 has been enabled.

If the second row block 320 has been selected by the row address RA, both the first and the second block selection signals XMAT<1> and XMAT<2> are enabled. In the same manner as that described above, the first and the second column selection signals Y11-Y13, RY1, Y21-Y23, and RY2 may be generated.

If the memory device is set as the second mode, the same column is repaired by a redundancy column in the first and third cell blocks 311 and 321, and the same column is repaired by a redundancy column in the second and the fourth cell blocks 312 and 322.

Figure 7:
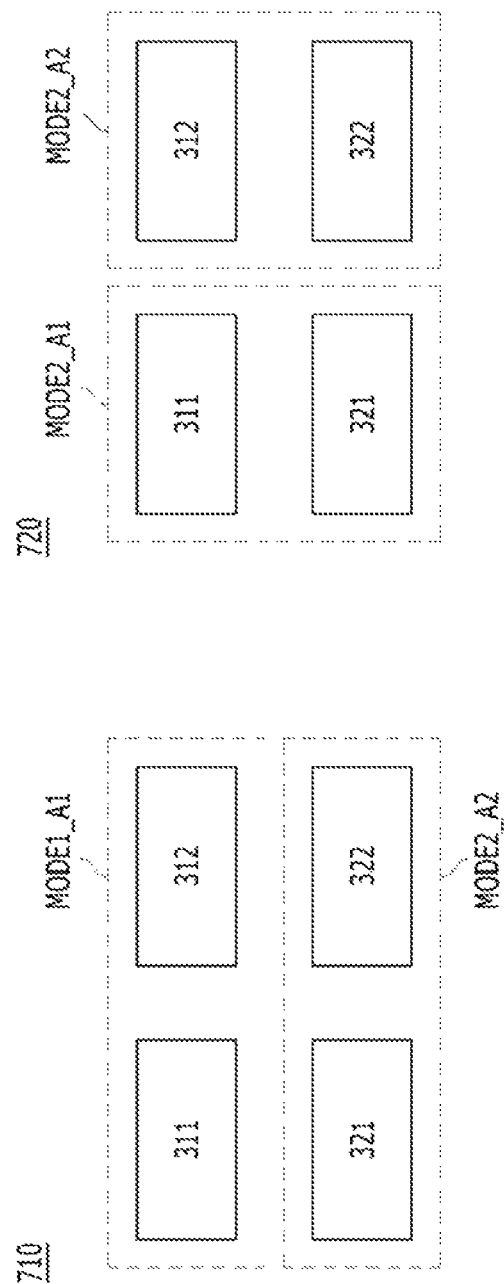
FIG. 7 is a diagram illustrating a difference between the first mode and the second mode in the memory device of FIG. 3.

FIG. 7 is a diagram illustrating a difference between the first mode and the second mode in the memory device of FIG. 3. A difference between the first mode and the second mode is described below using the first to fourth cell blocks 311, 312, 321, and 322. In FIG. 7, cell blocks whose column repair operations are controlled using the pieces of first and second repair information RI1 and RI2 are bundled and indicated by a dotted line.

A left-sided diagram 710 illustrates the first mode of the memory device of FIG. 3. Referring to the diagram 710, if the memory device is set as the first mode, the column repair operation of the first and the second cell blocks 311 and 312 is controlled using the first repair information RI1 (MODE1_A1), and the column repair operation of the third and the fourth cell blocks 321 and 322 is controlled using the second repair information RI2 (MODE1_A2).

A right-sided diagram 720 illustrates the second mode of the memory device of FIG. 3. Referring to the diagram 720, if the memory device is set as the second mode, the column repair operation of the first and third cell blocks 311 and 321 is controlled using the first repair information RI1 (MODE2_A1), and the column repair operation of the second and the fourth cell blocks 312 and 322 is controlled using the second repair information RI2 (MODE2_A2).

In the memory device of FIG. 3, the range of cell blocks on which a repair operation is performed using the pieces of first and second repair information may be different depending on the mode. In the first mode, the first and the second cell blocks are repaired using the first repair information, and the third and the fourth cell blocks are repaired using the second repair information. In the second mode, the first and the third cell blocks are repaired using the first repair information, and the second and the fourth cell blocks are repaired using the second repair information.

If columns having defects are detected by the memory device testing, it may be seen which one of the first and second modes is more advantageous to repair the memory device. Accordingly, the yield of memory devices can be improved by repairing columns of a memory device using a mode that is advantageous in repairing the memory device based on a result of the test.

Figure 8A:
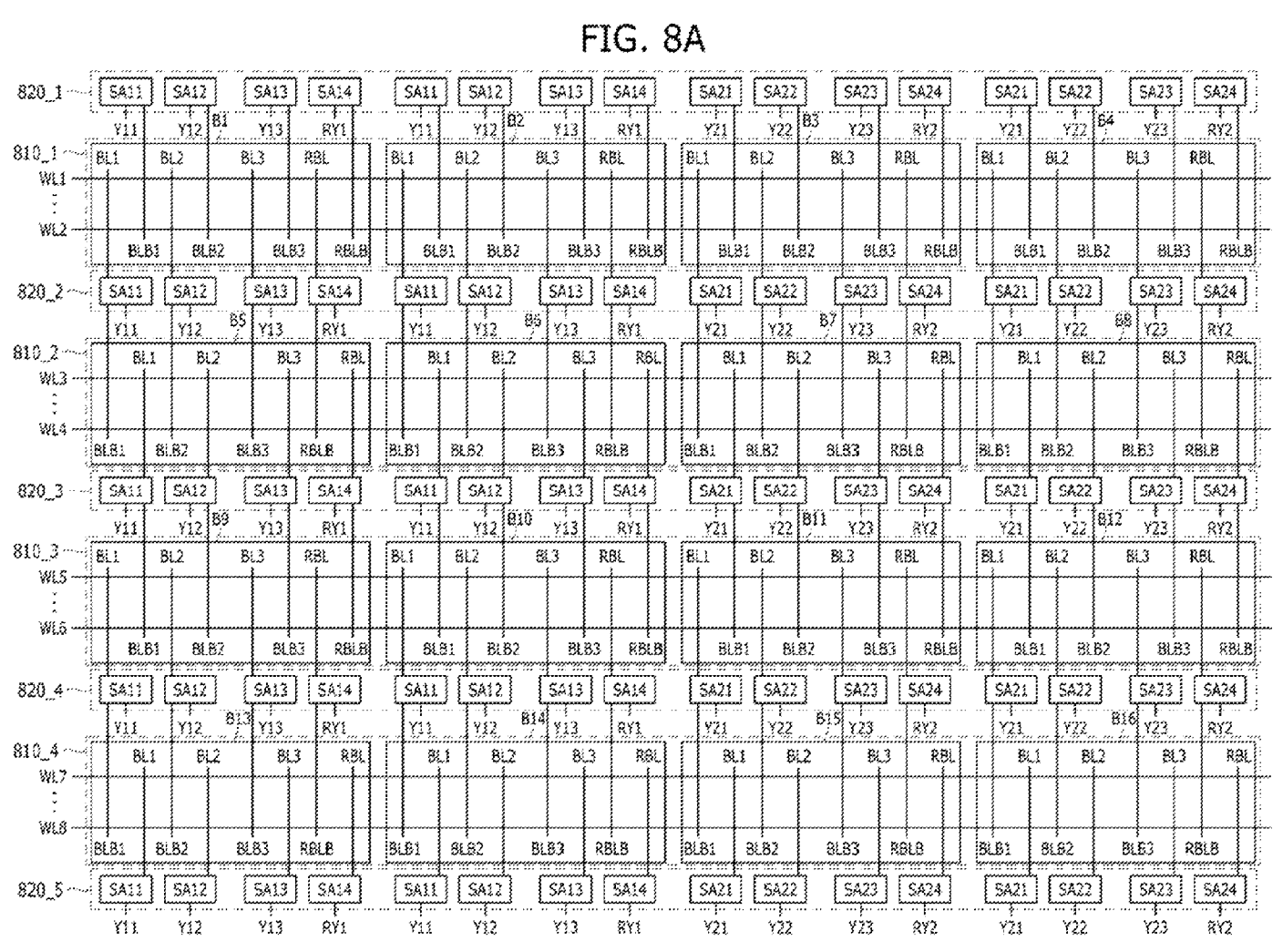
Figure 8B:
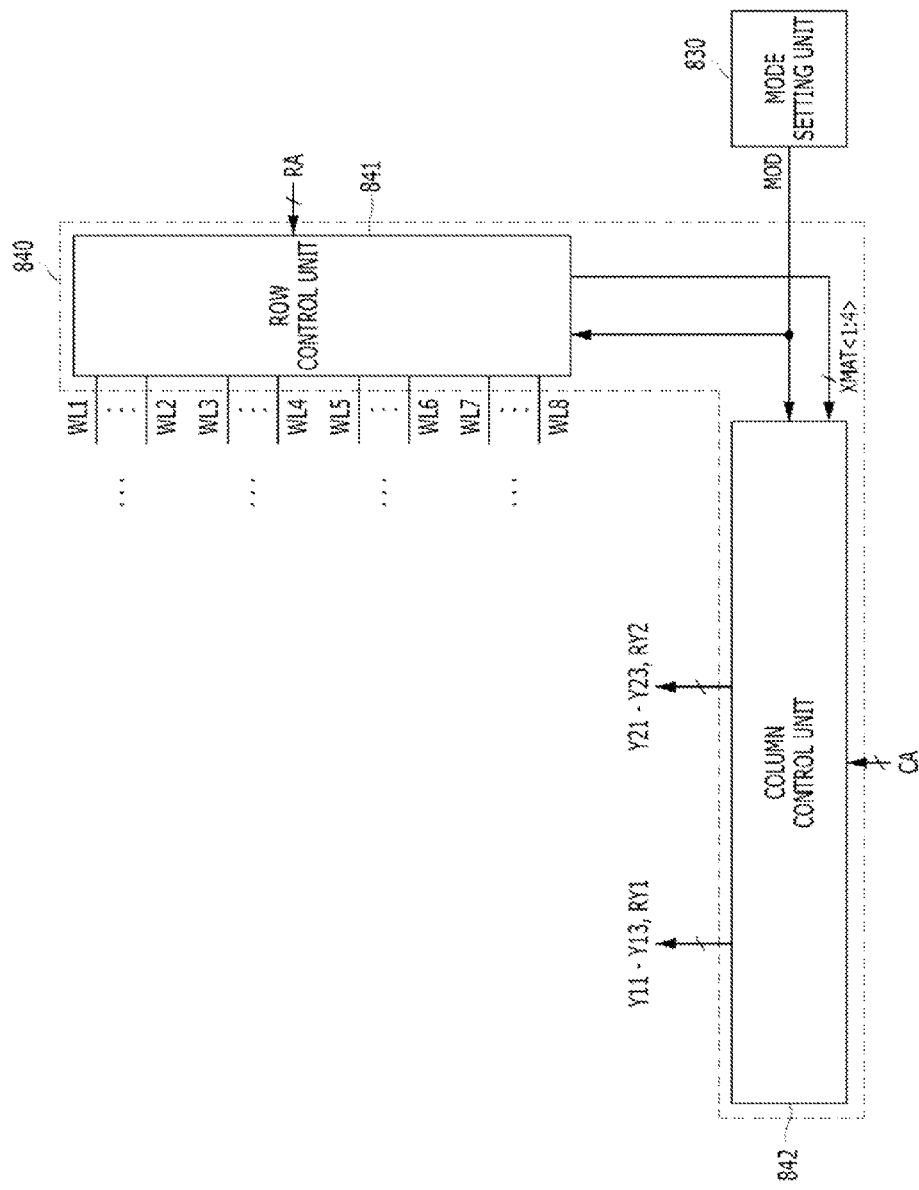

FIGS. 8A and 8B illustrate the configuration of a memory device in accordance with another embodiment of the present invention.

Referring to FIGS. 8A and 8B, the memory device may include first to fourth row blocks 810_1-810_4, first to fifth sense amplification units 820_1-820_5, a mode setting unit 830, and a control unit 840. Each of the first to fourth row blocks 810_1-810_4 may include four cell blocks B1-B16. For reference, FIG. 8A illustrates the first to fourth row blocks 810_1-810_4 and the first to fifth sense amplification units 820_1-820_5, and FIG. 8B illustrates the mode setting unit 830 and the control unit 840.

Hereinafter, a first mode may be an operation mode in which the columns of the first to fourth row blocks 810_1-810_4 are repaired using the respective first to fourth repair information RI1-RI4 (illustrated in FIG. 9). A second mode may be an operation mode in which the columns of the cell blocks (B1, B2, B5, and B6), (B3, B4, B7, and B8), (B9, B10, B13, and B14), and (B11, B12, B15, and B16) are repaired using the respective first to fourth repair information RI1-RI4.

If the memory device is set as the first mode, the first repair information RI1 may correspond to the first row block 810_1 and the cell blocks B1-B4 of the first row block 810_1. The second repair information RI2 may correspond to the second row block 810_2 and the cell blocks B5-B8 of the second row block 810_2. The third repair information RI3 may correspond to the third row block 810_3 and the cell blocks B9-B12 of the third row block 810_3. The fourth repair information RI4 may correspond to the fourth row block 810_4 and the cell blocks B13-B16 of the fourth row block 810_4. Furthermore, if the memory device is set as the second mode, the first repair information RI1 may correspond to the first row block 810_1/the second row block 810_2 and the cell blocks B1 and B2 of the first row block 810_1/the cell blocks B5 and B6 of the second row block 810_2. The second repair information RI2 may correspond to the first row block 810_1/the second row block 810_2 and the cell blocks B3 and B4 of the first row block 810_1/the cell blocks B7 and B8 of the second row block 810_2. The third repair information RI3 may correspond to the third row block 810_3/the fourth row block 810_4 and the cell blocks B9 and B10 of the third row block 810_3/the cell blocks B13 and B14 of the fourth row block 810_4. The fourth repair information RI4 may correspond to the third row block 810_3/the fourth row block 810_4 and the cell blocks B11 and B12 of the third row block 810_3/the cell blocks B15 and B16 of the fourth row block 810_4.

Each of the cell blocks B1-B16 may include normal columns BL1/BLB1-BL3/BLB3 and a redundancy column RBL/RBLB. The first to fourth row blocks 810_1-810_4 may respectively correspond to a plurality of first to fourth word lines WL1-WL2, WL3-WL4, WL5-WL6, and WL7-WL8. Memory cells (not illustrated in FIG. 8) may be coupled between each bit line and each word line. The cell blocks B1-B16 may have an open bit line structure.

Each of the first to fifth sense amplification units 820_1-820_5 may include a plurality of sense amplifiers SA11-SA14 and SA21-SA24. The sense amplifiers SA11-SA14 and SA21-SA24 may sense and amplify the data of a corresponding bit line. The plurality of sense amplifiers SA11-SA14 may correspond to respective column selection signals Y11-Y13 and RY1, and may be selected when the respective column selection signals are enabled. The plurality of sense amplifiers SA21-SA24 may correspond to respective column selection signals Y21-Y23 and RY2, and may be selected when the respective column selection signals are enabled.

The mode setting unit 830 may store setting information for setting the memory device in either the first mode or the second mode and generate a mode signal MOD indicating which one of the first and second modes the memory device has been set as. The mode setting unit 830 may enable the mode signal MOD if the memory device is set as the first mode and disable the mode signal MOD if the memory device is set as the second mode.

If the memory device is set as the first mode, the control unit 840 may repair normal columns using redundancy columns in the cell blocks B1-B16 included in the row blocks 810_1-810_4 using the first to fourth repair information RI1-RI4. Furthermore, if the memory device is set as the second mode, the control unit 840 may repair normal columns using redundancy columns in corresponding cell block groups using the first to fourth repair information RI1-RI4.

The control unit 840 may include a row control unit 841 and a column control unit 842. The row control unit 841 may select the row blocks 810_1-810_4 in response to a row address RA and generate first to fourth block selection signals XMAT<1:4> depending on whether the first mode or the second mode is selected. If the memory device is set as the first mode, the row control unit 841 may enable a block selection signal corresponding to a row block selected by the row address RA. Furthermore, if the memory device is set as the second mode, the row control unit 841 may enable the first and the second block selection signals XMAT<1:2> when the first row block 810_1 or the second row block 810_2 is selected and may enable the third and the fourth block selection signals XMAT<3:4> when the third row block 810_3 or the fourth row block 810_4 is selected.

The column control unit 842 may select a normal column or a redundancy column in a cell block selected in response to the column address CA, the block selection signals XMAT<1:4>, and the repair information RI1-RI4. The column control unit 842 generates column selection signals Y11-Y13, RY1, Y21-Y23, and RY2, but may enable a column selection signal corresponding to a selected column.

Figure 9:
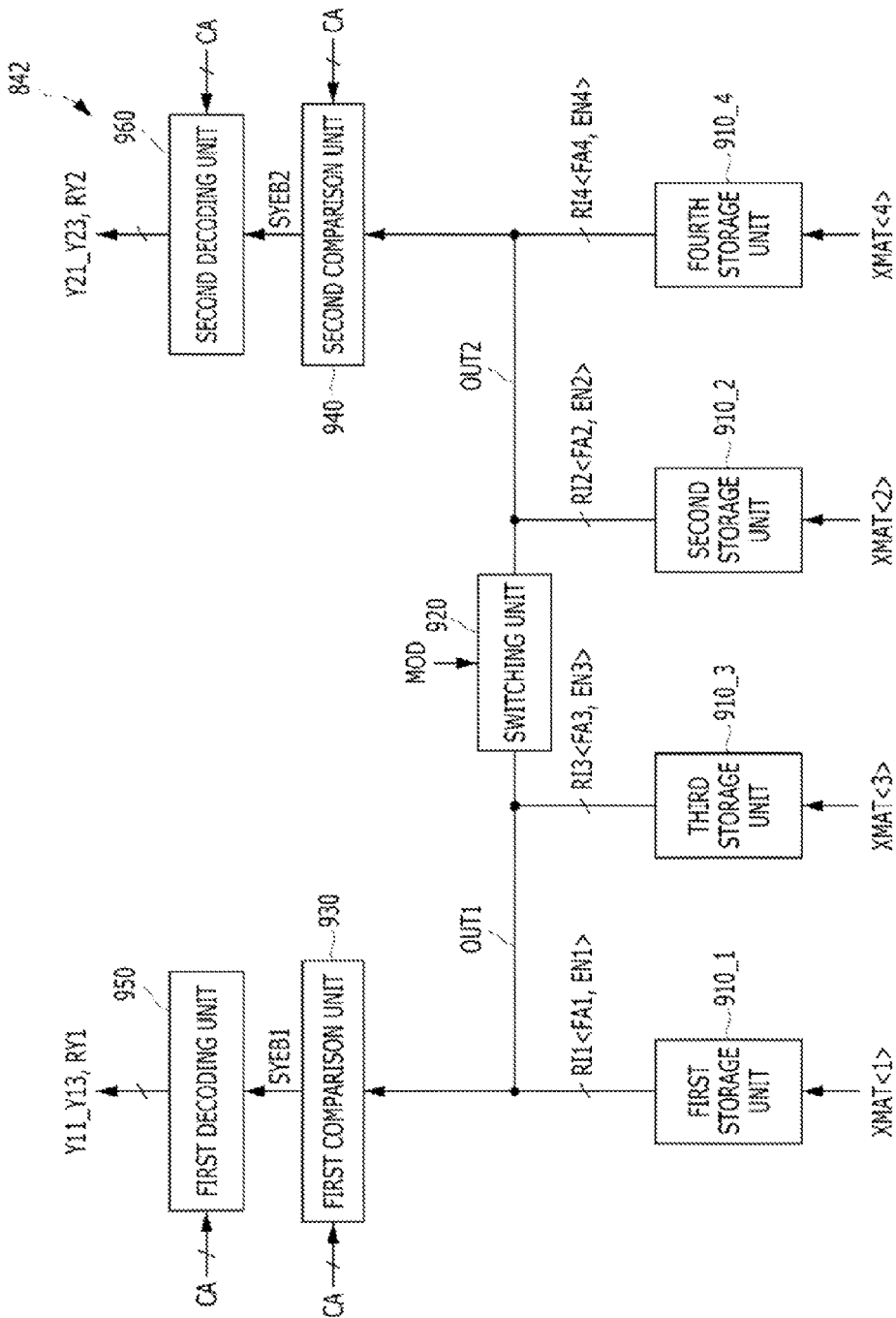
FIG. 9 illustrates the configuration of a column control unit 842 of FIG. 8.

FIG. 9 illustrates the configuration of the column control unit 842 of FIG. 8.

Referring to FIG. 9, the column control unit 842 may include first to fourth storage units 910_1-910_4, first and second output buses OUT1 and OUT2, a switching unit 920, first and second comparison units 930 and 940, and first and second decoding units 950 and 960.

The storage units 910_1-910_4 store the respective pieces of repair information RI1-RI4, and output the respective pieces of repair information RI1-RI4 when the respective block selection signals XMAT<1:4> are enabled.

The first output bus OUT1 is connected to the output terminals of the first and the third storage units 910_1 and 910_3, and may transfer the repair information RI1 or RI3 outputted by the first or third storage unit 910_1 or 910_3. The second output bus OUT2 is connected to the output terminals of the second and the fourth storage units 910_2 and 910_4, and may transfer the repair information RI2 or RI4 outputted by the second or fourth storage unit 910_2 or 910_4.

The operations of the switching unit 920, the comparison units 930 and 940, and the decoding units 950 and 960 are the same as those of the switching unit 430, the comparison units 440 and 450, and the decoding units 460 and 470 of FIG. 4.

The operation of the memory device of FIG. 8 is described below with reference to FIGS. 10 and 11.

Figure 10:
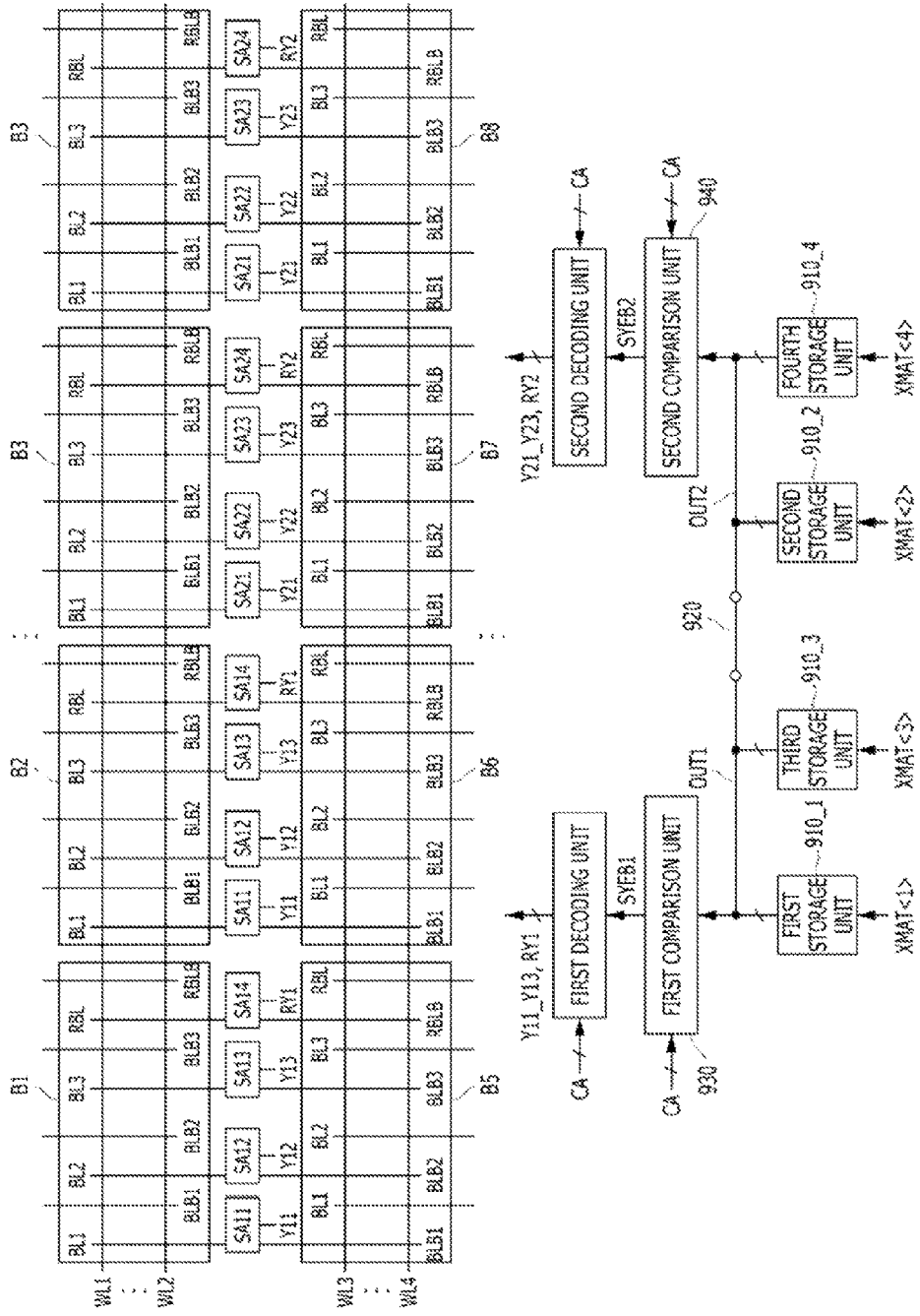
FIG. 10 is a diagram illustrating the operation of the memory device of FIG. 8 if the memory device is set as the first mode.

FIG. 10 is a diagram illustrating the operation of the memory device of FIG. 8 if the memory device is set as the first mode. FIG. 10 illustrates only the first and the second row blocks 810_1-820_2 and the column control unit 842. For example, FIG. 10 illustrates that the first repair information RI1 includes a column address corresponding to the column BL1/BLB1 and the second repair information RI2 includes a column address corresponding to the column BL2/BLB2. The mode signal MOD is enabled, and the switching unit 920 is turned on, and thus the first and the second output buses OUT1 and OUT2 are coupled.

The column control unit 842 may generate the column selection signals Y11-Y13, RY1, Y21-Y23, and RY2 in response to repair information that is outputted in response to an enabled one of the block selection signals XMAT<1:4>.

For example, when a word line of the first row block 810_1 is selected by the row address RA, the selected word line is activated, and the first block selection signal XMAT<1> is enabled. Accordingly, the first repair information RI1 is outputted. If the column address CA is different from a first column address FA1, the comparison units 930 and 940 disable comparison signals SYEB1 and SYEB2. The decoding units 950 and 960 enable respective column selection signals corresponding to the column address CA. If the column address CA corresponds to the column BL2/BLB2, the decoding units 460 and 470 may enable the respective column selection signals Y12 and Y22.

If the column address CA is the same as the first column address FA1, the comparison units 930 and 940 enable comparison signals SYEB1 and SYEB2. When the respective comparison signals SYEB1 and SYEB2 are enabled, the decoding units 950 and 960 enable the column selection signals RY1 and RY2.

If the memory device is set as the first mode, the cell blocks B1-B16 included in the row blocks 810_1-810_4 repair normal columns into redundancy columns using the same repair information. In the above example, the first row block 810_1 has been illustrated as being selected, but a repair operation may be performed according to the same process although another row block is selected.

Figure 11:
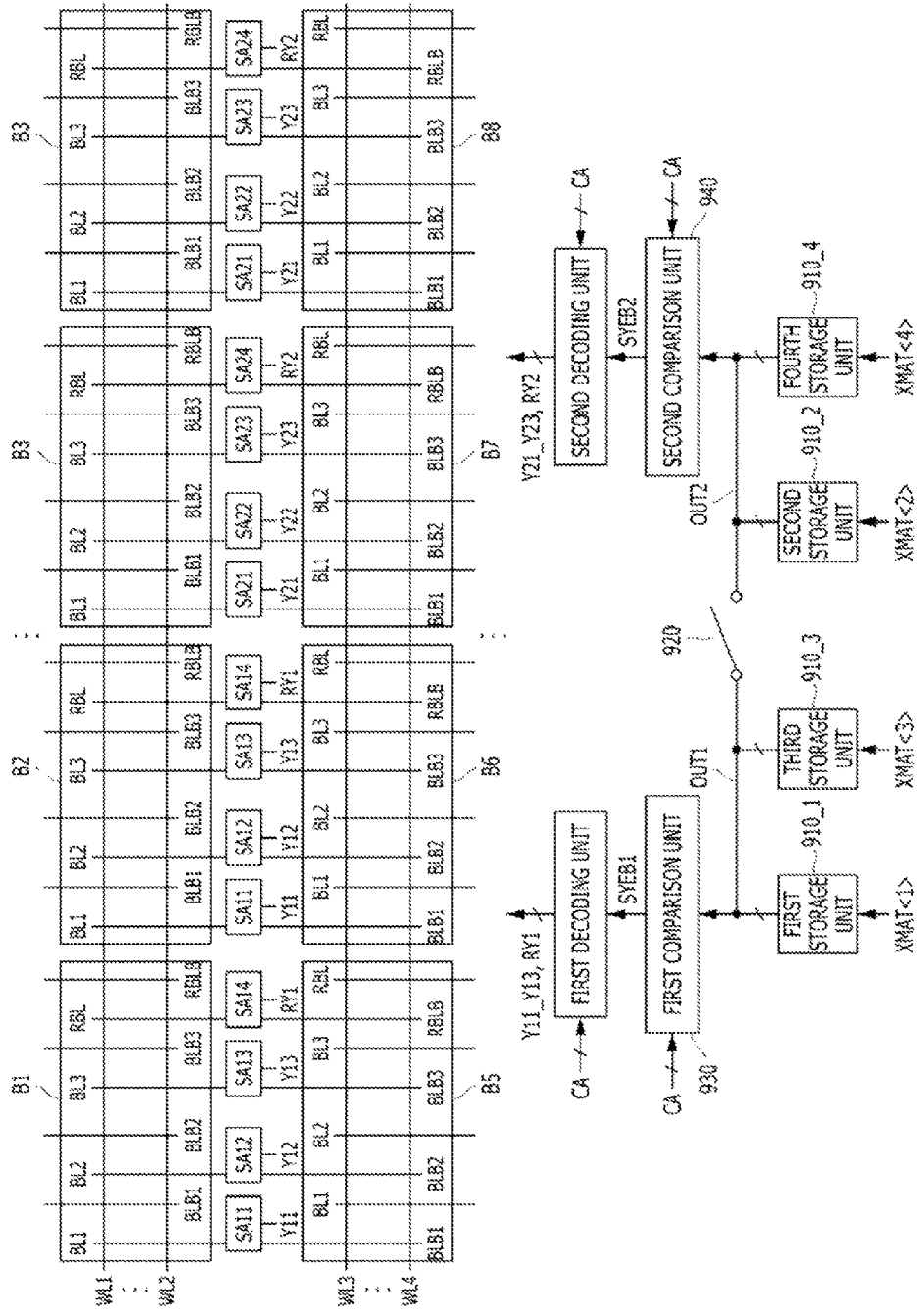
FIG. 11 is a diagram illustrating the operation of the memory device of FIG. 8 if the memory device is set as the second mode.

FIG. 11 is a diagram illustrating the operation of the memory device of FIG. 8 if the memory device is set as the second mode. FIG. 11 illustrates only the first and the second row blocks 810_1-820_2 and the column control unit 842. For example, FIG. 11 illustrates that the first and second repair information RI1 and RI2 includes the same column address as that of FIG. 10. The mode signal MOD is disabled, and the switching unit 920 is turned off, and thus the first and the second output buses OUT1 and OUT2 are blocked.

The column control unit 842 may generate the column selection signals Y11-Y13 and RY1 in response to the first or third repair information RI1 or RI3 and generate the column selection signals Y21-Y23 and RY2 in response to the second or fourth repair information RI2 or RI4.

When a word line of the first row block 810_1 is selected by the row address RA, the selected word line is activated and the block selection signals XMAT<1:2> are enabled. Accordingly, the pieces of first and second repair information RI1 and RI2 of the storage units 910_1 and 910_2 are outputted. The first repair information RI1 is transferred to the first comparison unit 930 through the first output bus OUT1, and the second repair information RI2 is transferred to the second comparison unit 940 through the second output bus OUT2.

If the column address CA corresponds to the column BL1/BLB1, the first comparison unit 930 enables the comparison signal SYEB1 because the column address CA is the same as the column address FA1, and the second comparison unit 940 disables the comparison signal SYEB2 because the column address CA is different from the column address FA2. The first decoding unit 950 enables the column selection signal RY1 because the comparison signal SYEB1 has been enabled, and the second decoding unit 960 enables the column selection signal Y21 corresponding to the column address CA because the comparison signal SYEB2 has been disabled.

If the column address CA corresponds to the column BL2/BLB2, the first comparison unit 930 disables the comparison signal SYEB1 because the column address CA is different from the column address FA1, and the second comparison unit 940 enables the comparison signal SYEB2 because the column address CA is the same as the column address FA2. The first decoding unit 460 enables the column selection signal Y12 corresponding to the column address CA because the comparison signal SYEB1 has been disabled, and the second decoding unit 470 enables the column selection signal RY2 because the comparison signal SYEB2 has been enabled.

Although the second row block 810_2 is selected by the row address RA, both the block selection signals XMAT<1: 2> are enabled. In the same manner as that described above, the column selection signals Y11-Y13, RY1, Y21-Y23, and RY2 may be generated.

If the memory device is set as the second mode, the cell blocks (B1, B2, B5, and B6), (B3, B4, B7, and B8), (B9, B10, B13, and B14), and (B11, B12, B15, and B16) repair normal columns into redundancy columns using the same repair information. In the above example, the first row block 810_1 has been illustrated as being selected, but a repair operation may be performed according to the same process although another row block is selected.

Figure 12:
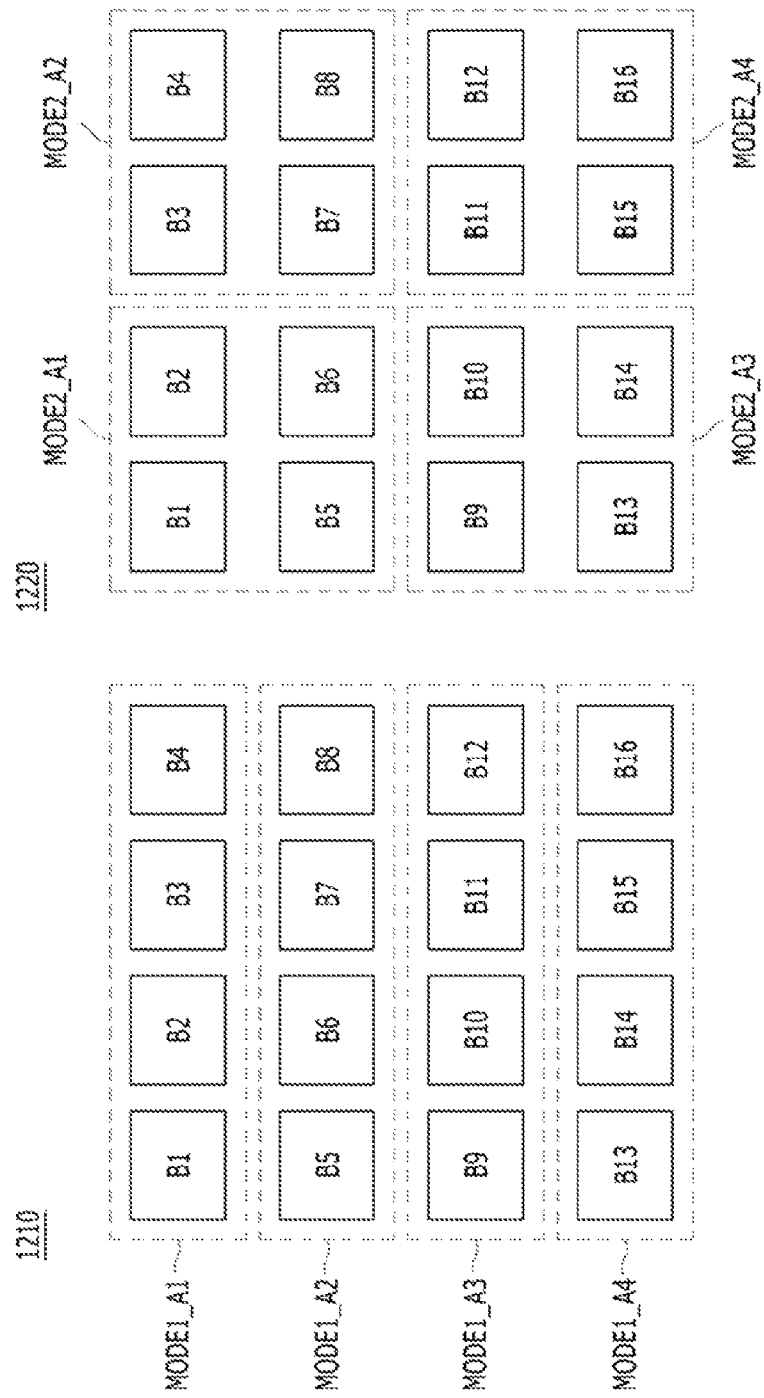
FIG. 12 is a diagram illustrating a difference between the first mode and the second mode in the memory device of FIG. 8.

FIG. 12 is a diagram illustrating a difference between the first mode and the second mode in the memory device of FIG. 8. A difference between the first mode and the second mode is described below using the cell blocks B1-B16. In FIG. 12, cell blocks whose column repair operation is controlled using each of the pieces of repair information RI1-RI4 are bundled and indicated by a dotted line.

A left-sided diagram 1210 illustrates the first mode of the memory device of FIG. 8. Referring to the diagram 1210, if the memory device is set as the first mode, the column repair operation of the cell blocks B1-B4 is controlled using the first repair information RI1 (MODE1_A1), and the column repair operation of the cell blocks B5-B8 is controlled using the second repair information RI2 (MODE1_A2), and the column repair operation of the cell blocks B9-B12 is controlled using the third repair information RI3 (MODE1_A3), and the column repair operation of the cell blocks B13-B16 is controlled using the fourth repair information RI4 (MODE1_A4).

A right-sided diagram 1220 illustrates the second mode of the memory device of FIG. 8. Referring to the diagram 1220, if the memory device is set as the second mode, the column repair operation of the cell blocks B1, B2, B5, and B6 is controlled using the first repair information RI1 (MODE2_A1), and the column repair operation of the cell blocks B3, B4, B7, and B8 is controlled using the second repair information RI2 (MODE2_A2), and the column repair operation of the cell blocks B9, B10, B13, and B14 is controlled using the third repair information RI3 (MODE2_A3), and the column repair operation of the cell blocks B11, B12, B15, and B16 is controlled using the fourth repair information RI4 (MODE2_A4).

In the memory device of FIG. 8, the range of cell blocks on which a repair operation is performed using the repair information may be different depending on the mode. If columns having defects are detected by the memory device test, it may be seen which one of the first and second modes is more advantageous to repair the memory device. Accordingly, the yield of memory devices can be improved by repairing columns of a memory device using a mode that is advantageous in repairing the memory device based on a result of the test.

In a memory device, the range of cell blocks on which a column repair operation is performed using of the repair information may be differently set. In FIGS. 3 and 8, cell blocks covered by the same repair information have been illustrated as neighboring one another, and the same number of cell blocks have been illustrated as being covered by each piece of the repair information. In some embodiments, cell blocks covered by the same repair information may be spaced apart or the number of cells blocks covered by each piece of repair information may be different.

In accordance with this technology, more columns can be repaired because the memory devices choose a column repair mode that is most advantageous.

In accordance with this technology, the yield of memory devices can be increased by increasing the flexibility of the column repair of a memory device.

Although various embodiments have been described for illustrative purposes, it will be apparent to those skilled in the art that various changes and modifications may be made without departing from the spirit and scope of the invention as defined in the following claims.

What is claimed is:

1. A memory device, comprising:
   first to fourth cell blocks each comprising a plurality of normal columns and one or more redundancy columns; and
   a control unit suitable for repairing the normal columns using the redundancy columns in the first and the second cell blocks using first repair information and repairing the normal columns using the redundancy columns in the third and the fourth cell blocks using second repair information when the memory device is set as a first mode, and suitable for repairing the normal columns using the redundancy columns in the first and the third cell blocks using the first repair information and repairing the normal columns using the redundancy columns in the second and the fourth cell blocks using the second repair information when the memory device is set as a second mode.

2. The memory device of claim 1,
   wherein each of the normal columns and the redundancy columns comprises a pair of bit lines, and
   wherein each of the first to fourth cell blocks comprises an open bit line structure.

3. The memory device of claim 1, further comprising:
   a plurality of first sense amplifiers connected to corresponding columns of the normal or redundancy columns of the first and the third cell blocks and suitable for sensing and amplifying data of the connected columns; and
   a plurality of second sense amplifiers connected to corresponding columns of the normal or redundancy columns of the second and the fourth cell blocks and suitable for sensing and amplifying data of the connected columns.

4. The memory device of claim 1, further comprising:
   a plurality of first word lines corresponding to the first and the second cell blocks; and
   a plurality of second word lines suitable for corresponding to the third and the fourth cell blocks in common.

5. The memory device of claim 1, wherein each of the first and second repair information comprises a column address of a defective normal column.

6. The memory device of claim 1, wherein the control unit comprises:
a row control unit suitable for enabling a first block selection signal when a first row block comprising the first and the second cell blocks is selected and enabling a second block selection signal when a second row block comprising the third and the fourth cell blocks is selected, in the first mode, and suitable for enabling the first and the second block selection signals when the first row block or second row block is selected in the second mode.

7. The memory device of claim 6, wherein the control unit further comprises:
a column control unit suitable for selecting a normal column or a redundancy column in one or more cell blocks selected from the first to fourth cell blocks in response to a column address, one or more of the first and the second block selection signals, and one or more of the first and second repair information.

8. The memory device of claim 7, wherein the column control unit comprises:
a first storage unit suitable for storing the first repair information and outputting the first repair information when the first block selection signal is enabled;
a second storage unit suitable for storing the second repair information and outputting the second repair information when the second block selection signal is enabled;
a first output bus coupled to an output terminal of the first storage unit;
a second output bus coupled to an output terminal of the second storage unit; and
a switching unit coupled between the first and the second output buses, and suitable for coupling the first and the second output buses in the first mode, and blocking the first and the second output buses in the second mode.

9. The memory device of claim 8, wherein the column control unit further comprises:
a first comparison unit suitable for comparing repair information of the first output bus with the column address and enabling a first comparison signal when the repair information of the first output bus is identical to the column address;
a second comparison unit suitable for comparing repair information of the second output bus with the column address and enabling a second comparison signal when the repair information of the second output bus is identical to the column address;
a first decoding unit suitable for generating a plurality of first column selection signals corresponding to the respective normal and redundancy columns of the first and the third cell blocks, enabling a first column selection signal corresponding to the column address when the first comparison signal is disabled, and enabling a first column selection signal corresponding to a redundancy column when the first comparison signal is enabled; and
a second decoding unit suitable for generating a plurality of second column selection signals corresponding to the respective normal and redundancy columns of the second and the fourth cell blocks, enabling a second column selection signal corresponding to the column address when the second comparison signal is disabled, and enabling a second column selection signal corresponding to a redundancy column when the second comparison signal is enabled.

10. The memory device of claim 1, further comprising:
a mode setting unit suitable for storing setting information for setting the memory device as one of the first mode and the second mode and generating a mode signal corresponding to a mode set based on the setting information.

11. A memory device, comprising:
a plurality of row blocks each comprising a plurality of cell blocks, each comprising a plurality of normal columns and one or more redundancy columns; and
a control unit suitable for storing a plurality of pieces of repair information each corresponding to one of the row blocks in a first mode and corresponding to two or more of the row blocks in a second mode,
wherein the control unit repairs normal columns using redundancy columns in a plurality of cell blocks corresponding to the one of the row blocks in the first mode, and repairs normal columns using redundancy columns in one or more of cell blocks corresponding to the two or more of the row blocks in the second mode
wherein the control unit comprises:
a row control unit suitable for generating a plurality of block selection signals respectively corresponding to the plurality of row blocks, enabling a block selection signal that corresponds to a selected row block in the first mode, and enabling two or more block selection signals that correspond to the selected row block and a row block corresponding to the same repair information as the selected row block in the second mode.

12. The memory device of claim 11, wherein the control unit further comprises:
a column control unit suitable for selecting normal columns or redundancy columns in one or more selected cell blocks of a plurality of cell blocks included in a row block selected from the plurality of row blocks in response to a column address, one or more of the plurality of block selection signals, and one or more of the plurality of repair information.

13. The memory device of claim 12, wherein the column control unit comprises:
a plurality of storage units suitable for storing the plurality of pieces of repair information, respectively, and outputting a corresponding piece of repair information when a corresponding block selection signal of the plurality of block selection signals is enabled;
two or more output buses coupled to an output terminal of a corresponding storage unit; and
one or more switching units coupled between the two or more output buses, and suitable for coupling the two or more output buses in the first mode, and blocking the two or more output buses in the second mode.

14. The memory device of claim 13, wherein the column control unit further comprises:
two or more comparison units each suitable for comparing the repair information with the column address and enabling a comparison signal when the repair information is identical to the column address; and
two or more decoding units suitable for generating a plurality of column selection signals corresponding to the respective normal and redundancy columns in the one or more selected cell blocks, enabling a column selection signal corresponding to the column address when a corresponding comparison signal is disabled, and enabling a column selection signal corresponding to a redundancy column when the corresponding comparison signal is enabled.

15. A memory device, comprising:
first to N-th row blocks each comprising first to M-th cell blocks each comprising a plurality of normal columns and one or more redundancy columns, wherein the N and M are natural numbers and the first to M-th cell blocks are divided into first and second groups; and
a control unit suitable for storing first to N-th repair information, wherein K-th repair information corresponds to a K-th row block in a first mode, and K-th and (K+1)-th repair information corresponds to both K-th and (K+1)-th row blocks in a second mode, and the K is an odd number where 1<K<N,
wherein the control unit repairs normal columns using redundancy columns in first to M-th cell blocks of the K-th row block using the K-th repair information in a first mode, and repairs normal columns using redundancy columns in a first group of cell blocks of the K-th and (K+1)-th row blocks using the K-th repair information and normal columns using redundancy columns in a second group of cell blocks of the K-th and (K+1)-th row blocks using the (K+1)-th repair information.

16. The memory device of claim 15, wherein the control unit comprises:
a row control unit suitable for generating first to N block selection signals respectively corresponding to the first to N row blocks, enabling a block selection signal that corresponds to a selected row block in the first mode, and enabling both K-th and (K+1)-th block selection signals when the K-th row block or the (K+1)-th row block is selected in the second mode.

17. The memory device of claim 16, wherein the control unit further comprises:
a column control unit suitable for selecting normal columns or redundancy columns in one or more selected cell blocks of first to M-th cell blocks of a row block selected from the first to N-th row blocks in response to a column address, one or more of the first to N block selection signals, and one or more of the first to N-th repair information.

18. The memory device of claim 17, wherein the column control unit comprises:

first to N storage units suitable for storing the first to N-th repair information, respectively, and outputting the first to N-th repair information when the first to N block selection signals are enabled, respectively;
a first output bus connected to output terminals of storage units that store the K-th repair information among the first to N storage units;
a second output bus connected to output terminals of storage units that store the (K+1)-th repair information among the first to N storage units; and
a switching unit coupled between the first and the second output buses, and suitable for connecting the first and the second output buses in the first mode, and blocking the first and the second output buses in the second mode.

19. The memory device of claim 18, wherein the column control unit further comprises:
a first comparison unit suitable for comparing repair information of the first output bus with the column address and enabling a first comparison signal when the repair information of the first output bus is identical to the column address;
a second comparison unit suitable for comparing repair information of the second output bus with the column address and enabling a second comparison signal when the repair information of the second output bus is identical to the column address;
a first decoding unit suitable for generating a plurality of first column selection signals respectively corresponding to the normal and redundancy columns in the one or more selected cell blocks, enabling a first column selection signal corresponding to the column address when the first corresponding comparison signal is disabled, and enabling a first column selection signal corresponding to a redundancy column when the first comparison signal is enabled; and
a second decoding unit suitable for generating a plurality of second column selection signals respectively corresponding to the normal and redundancy columns in the one or more selected cell blocks, enabling a second selection column signal corresponding to the column address when the second corresponding comparison signal is disabled, and enabling a second column selection signal corresponding to a redundancy column when the second comparison signal is enabled.

* * * * *